United States Patent
Kovacic et al.

(10) Patent No.: US 9,673,713 B2
(45) Date of Patent: Jun. 6, 2017

(54) GATE DRIVE POWER SUPPLY FOR MULTILEVEL CONVERTER

(71) Applicant: OTIS ELEVATOR COMPANY, Farmington, CT (US)

(72) Inventors: Marinko Kovacic, Zagrebacka (HR); Shashank Krishnamurthy, Rocky Hill, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 16 days.

(21) Appl. No.: 14/649,293

(22) PCT Filed: Dec. 4, 2012

(86) PCT No.: PCT/US2012/067715
§ 371 (c)(1),
(2) Date: Jun. 3, 2015

(87) PCT Pub. No.: WO2014/088551
PCT Pub. Date: Jun. 12, 2014

(65) Prior Publication Data
US 2015/0318788 A1    Nov. 5, 2015

(51) Int. Cl.
*H02M 7/5387* (2007.01)
*H02M 7/521* (2006.01)
(Continued)

(52) U.S. Cl.
CPC ......... *H02M 3/33507* (2013.01); *H02M 1/08* (2013.01); *H02M 3/07* (2013.01);
(Continued)

(58) Field of Classification Search
CPC ........ H02M 7/48; H02M 7/487; H02M 7/493; H02M 7/537; H02M 7/53846; H02M 7/538466; H02M 7/5387; H02M 7/53871
(Continued)

(56) References Cited

U.S. PATENT DOCUMENTS

| | | | | |
|---|---|---|---|---|
| 2009/0195068 A1* | 8/2009 | Ohashi | ................. | H03K 17/162 307/18 |
| 2011/0141779 A1* | 6/2011 | Joseph | ................. | H02M 7/487 363/95 |
| 2012/0257430 A1* | 10/2012 | Truettner | .............. | H02M 7/487 363/131 |

FOREIGN PATENT DOCUMENTS

| | | |
|---|---|---|
| DE | 102009002332 A1 | 10/2010 |
| JP | H05015165 A | 1/1993 |
| JP | 2009177951 A | 8/2009 |

OTHER PUBLICATIONS

International Search Report for application PCT/US2012/067715, dated Aug. 27, 2013, 5 pages.
Welchko, Brian A., et al., "A Three-Level MOSFET Inverter for Low-Power Drives", IEEE Transactions on Industrial Electronics, Jun. 2004, vol. 51, No. 3, pp. 669-674.
Written Opinion for application PCT/US2012/067715, dated Aug. 27, 2013, 5 pages.
(Continued)

*Primary Examiner* — Adolf Berhane
*Assistant Examiner* — Gary Nash
(74) *Attorney, Agent, or Firm* — Cantor Colburn LLP

(57) ABSTRACT

A neutral point clamped, multilevel level converter including a DC voltage link having a positive rail and a negative rail; a phase leg coupled to an AC node, the phase leg having a first switch and a second switch in series between the negative rail and the AC node, the phase leg having a third switch and a fourth switch in series between the positive rail and the AC node; and a gate drive power supply having a charge pump section, the charge pump section generating a first gate drive voltage for the first switch and a second gate drive voltage for the second switch.

12 Claims, 3 Drawing Sheets

(51) Int. Cl.
    *H02M 3/335*     (2006.01)
    *H02M 7/487*     (2007.01)
    *H03K 17/567*     (2006.01)
    *H02M 1/08*     (2006.01)
    *H02M 3/07*     (2006.01)
    *H02M 1/00*     (2006.01)

(52) U.S. Cl.
    CPC .......... *H02M 7/487* (2013.01); *H03K 17/567* (2013.01); *H02M 2001/0006* (2013.01); *H03K 2217/0081* (2013.01)

(58) Field of Classification Search
    USPC .......................... 363/124, 131, 132, 135–138
    See application file for complete search history.

(56) References Cited

OTHER PUBLICATIONS

European Search Report for application EP 12889612.3, dated Jun. 21, 2016, 9 pages.
Park, Shihong et al., "A Self Boost Charge Pump Topology for a Gate Drive High-Side Power Supply", IEEE Transactions on Power Electronics, vol. 20, No. 2, Mar. 2005, p. 300-307.

\* cited by examiner

GATE DRIVE POWER SUPPLY FOR MULTILEVEL CONVERTER

FIELD OF INVENTION

The subject matter disclosed herein relates generally to the field of power conversion systems, and more particularly, to a gate drive power supply for a multilevel converter.

DESCRIPTION OF RELATED ART

Neutral point clamped (NPC) multilevel converters are used to convert a DC signal to an AC signal and to convert an AC signal to a DC signal. Three level NPC converters have a high acceptance by the industry, but require a higher number of switches than two level converters. A two level converter employs two switches per phase leg for a total of 6 switches for a 3 phase output. Three level NPC converters employ 4 switches in each phase leg, or twice the number of switches in a two level converter. Due to the increased number of active switches, the number of the gate drive units also has to be increased. Each of the gate drive units has its own floating power supply, such as a transformer isolated power supply for each switch. This approach increases the number of components and can negatively affect the total cost of the converter, particularly in low power applications.

BRIEF SUMMARY

According to an exemplary embodiment of the invention, a neutral point clamped, multilevel level converter including a DC voltage link having a positive rail and a negative rail; a phase leg coupled to an AC node, the phase leg having a first switch and a second switch in series between the negative rail and the AC node, the phase leg having a third switch and a fourth switch in series between the positive rail and the AC node; and a gate drive power supply having a charge pump section, the charge pump section generating a first gate drive voltage for the first switch and a second gate drive voltage for the second switch.

Other aspects, features, and techniques of embodiments of the invention will become more apparent from the following description taken in conjunction with the drawings.

BRIEF DESCRIPTION OF THE DRAWINGS

Referring now to the drawings wherein like elements are numbered alike in the FIGURES.

DETAILED DESCRIPTION

Figure 1:
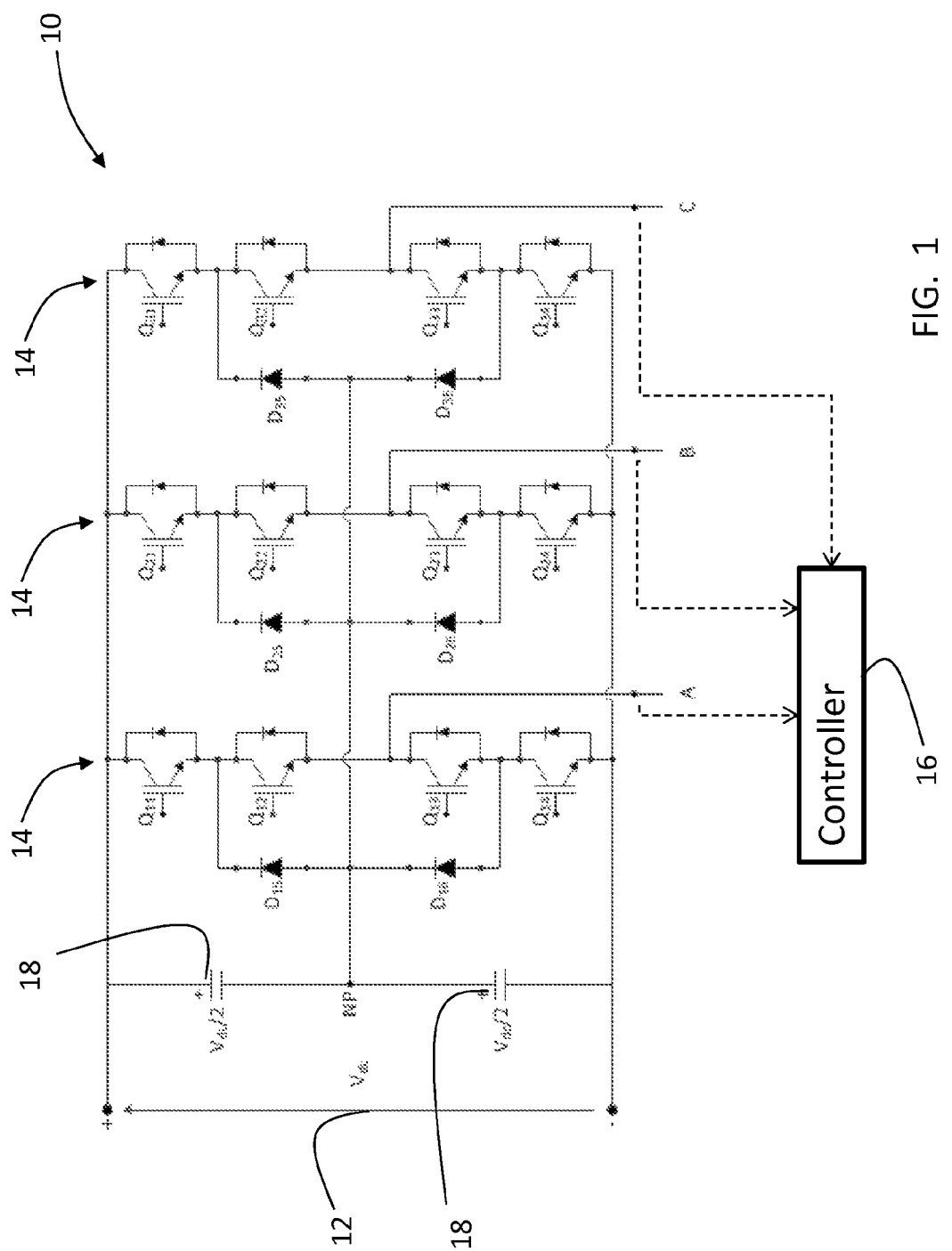
FIG. 1 is a schematic diagram of an NPC multilevel converter in an exemplary embodiment.

FIG. 1 is a schematic diagram of an NPC three phase, three level converter 10 in an exemplary embodiment. The converter 10 can operate in a generative mode or a regenerative mode. In generative mode, a DC signal from DC link 12 is converted to an AC signal. Two capacitors 18 are connected in series across the DC link 12, with the capacitor junction being referred to as the neutral point (NP). Converter 10 generates a single phase AC signal at each of AC nodes A, B and C. Each leg 14 of the converter 10 generates one of the AC phases. As known in the art, switches Q are controlled by a controller 16 to generate AC waveforms. Each leg 14 includes clamping neutral diodes, D, to clamp the leg output to a neutral point NP. In regenerative mode, an AC signal on one or more of AC nodes A, B and C is converted to a DC signal and supplied to DC link 12. In regenerative mode, switches Q are controlled by controller 16 to generate a DC signal at DC link 12. Switches Q may be transistors as known in the art. Controller 16 may be implemented using a general-purpose microprocessor executing a computer program stored on a storage medium to perform the operations described herein. Alternatively, controller 16 may be implemented in hardware (e.g., ASIC, FPGA) or in a combination of hardware/software.

Figure 2:
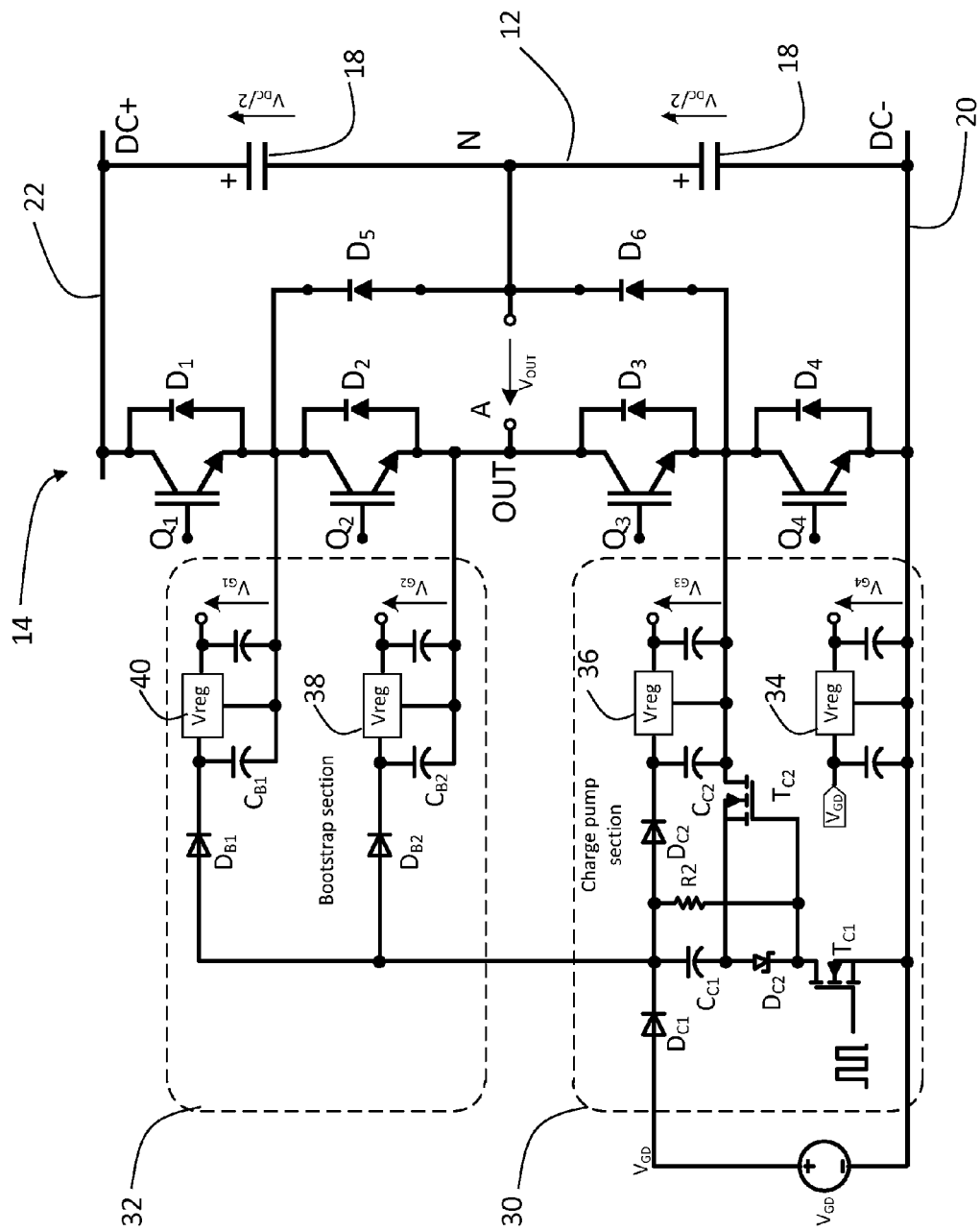
FIG. 2 depicts a gate drive power supply in an exemplary embodiment.

FIG. 2 depicts an exemplary gate drive power supply for an NPC three phase, three level converter. Only one leg 14 is depicted in FIG. 2, for ease of illustration. DC link 12 includes a negative rail 20 and a positive rail 22. Capacitors 18 are connected in series between the negative rail 20 and positive rail 22, intersecting at a neutral point, N. Leg 14 includes four switches, $Q_1$-$Q_4$, which may be transistors. Switches $Q_3$-$Q_4$ are coupled in series from the AC node A to the negative rail 20. Switch $Q_4$ has a terminal connected to the negative rail 20 and switch $Q_3$ has a terminal connected to the AC node A. Clamping diode $D_6$ connects the junction of switches $Q_3$-$Q_4$ to the neutral point of the DC link 12. Flyback diodes $D_3$ and $D_4$ are positioned across terminals of switches $Q_3$ and $Q_4$, respectively.

Switches $Q_1$-$Q_2$ are coupled in series from the positive rail 22 to AC node A. Switch $Q_1$ has a terminal connected to the positive rail 22 and switch $Q_2$ has a terminal connected to the AC node A. Clamping diode $D_5$ connects the junction of switches $Q_1$-$Q_2$ to the neutral point of the DC link 12. Flyback diodes $D_1$ and $D_2$ are positioned across terminals of switches $Q_1$ and $Q_2$, respectively. The possible output states, $V_{OUT}$, at the AC node A are VDC+ (when switches $Q_1$ and $Q_2$ are closed), ZERO (when switches $Q_2$ and $Q_3$ are closed) and VDC− (switches $Q_3$ and $Q_4$ are closed).

Also shown in FIG. 2 is a gate drive power supply to provide a gate drive voltage to switches $Q_1$-$Q_4$. The gate drive power supply includes two sections, a charge pump section 30 and a bootstrap section 32. The charge pump section 30 provides gate drive voltages to switches $Q_4$ and $Q_3$. The bootstrap section 32 provides gate drive voltages to switches $Q_1$ and $Q_2$. Each leg 14 has a charge pump section 30 and a bootstrap section 32.

The charge pump section 30 includes a gate drive voltage source, $V_{GD}$, which is tied to the negative DC rail 20. The voltage output of gate drive voltage source $V_{GD}$ is substantially larger than the desired voltage on the bootstrap capacitors $C_{B1}$ and $C_{B2}$, due to the voltage drop on the diodes and active switches in the power supply.

Charge pump section 30 includes a voltage regulator 34 that receives an output from the gate drive voltage source $V_{GD}$ and converts it to a first gate drive voltage, $V_{G4}$, for gate drive circuitry of switch $Q_4$.

Charge pump section 30 is also used to obtain a second gate drive voltage, $V_{G3}$, for the gate drive circuitry of switch $Q_3$. A pulsed gate drive signal is used to turn charge pump transistor $T_{C1}$ on and off. The pulsed gate drive signal can be shared among all of the phase legs 14. In a charging mode, charge pump transistor $T_{C1}$ is turned on and boost capacitor $C_{C1}$ is charged by the gate drive voltage source $V_{GD}$ through diodes $D_{C1}$ and $D_{C2}$. Transistor $T_{C2}$ and diode $D_{C2}$ remain off since the gate-source voltage at transistor $T_{C2}$ is forced to $D_{C2}$ during the charging mode.

When charge pump transistor $T_{C1}$ is turned off, the charge pump section 30 enters a boost mode. The voltage on boost capacitor $C_{C1}$ starts to charge the gate capacitance of transistor $T_{C2}$ through resistor $R_2$. The voltage at the negative (lower) terminal of boost capacitor $C_{C1}$ rises from ground level to VDC+ as charge pump transistor $T_{C1}$ turns off and the drain-source voltage of transistor $T_{C2}$ decreases.

Once $T_{C2}$ fully turns on, the power supply enters a pumping mode. Charge in the boost capacitor $C_{C1}$ is transferred to the high-side capacitor $C_{C2}$ that serves as the local supply for the gate of switch $Q_3$. A voltage regulator 36 receives an output from high-side capacitor $C_{C2}$ and converts it to a second gate drive voltage, $V_{G3}$, for gate drive circuitry of switch $Q_3$. The pumping mode ends when charge pump transistor $T_{C1}$ is turned on again by the external control. Continuous switching of charge pump transistor $T_{C1}$ insures that gate drive charge is available at all times to the switch $Q_3$ without any interference with the desired phase-leg switching sequence. A benefit using charge pump section 30 is that transistors $T_{C1}$ and $T_{C2}$ can be rated to half of the DC link voltage. This is achieved because the voltage swing on transistor $Q_4$ is limited to the half of the DC link voltage ($V_{DC}/2$).

Once a stable second gate drive voltage, $V_{G3}$, is available at the source terminal of the transistor $Q_3$, gate drive voltages $V_{G1}$ and $V_{G2}$ for the switches $Q_1$ and $Q_2$, respectively, can be obtained from the second gate drive voltage $V_{G3}$ using bootstrap section 32. As noted above, the gate drive voltage source, $V_{GA}$, provides voltage to create gate drive voltages $V_{G1}$ and $V_{G2}$. Thus, a single power supply is used to generate all the gate drive voltages.

The bootstrap section 32 receives charge from the boost capacitor $C_{C1}$ and charges bootstrap capacitors $C_{B1}$ and $C_{B2}$ using diodes $D_{B1}$ and $D_{B2}$, respectively. Bootstrap capacitor $C_{B2}$ is charged through the diode $D_{B2}$ and charge pump transistor $T_{C1}$ when switch $Q_3$ is closed. A voltage regulator 38 receives an output from bootstrap capacitor $C_{B2}$ and converts it to a third gate drive voltage, $V_{G2}$, for gate drive circuitry of switch $Q_2$. Bootstrap capacitor $C_{B1}$ is charged through the diode $D_{B1}$ and charge pump transistor $T_{C1}$ when switches $Q_2$ and $Q_3$ are closed. A voltage regulator 40 receives an output from bootstrap capacitor $C_{B1}$ and converts it to a fourth gate drive voltage, $V_{G1}$, for gate drive circuitry of switch $Q_1$.

Figure 3:
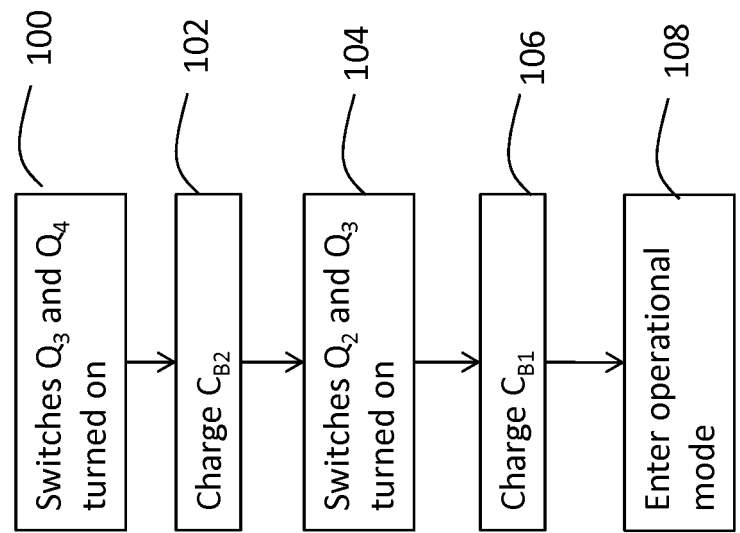
FIG. 3 depicts an initialization process in exemplary embodiment.

An initialization sequence is used at the startup of the converter 10 to ensure initial charging of capacitors in the charge pump and bootstrap sections. FIG. 3 depicts an initialization process in exemplary embodiments. The process beings at 100, where switches $Q_3$ and $Q_4$ are turned on with switches $Q_1$ and $Q_2$ off. This sets the output at AC node A to VDC− for phase leg 14. The gate drive voltages for switches $Q_3$ and $Q_4$ are available from the gate drive voltage source $V_{GD}$ and the charge pump section 30. At 102, bootstrap capacitor $C_{B2}$ is charged through a current path from gate drive voltage source $V_{GD}$, capacitor $C_{B2}$ and switches $Q_3$-$Q_4$.

At 104, switches $Q_2$ and $Q_3$ are turned on with switches $Q_1$ and $Q_4$ off. This sets the output at AC node A to zero for phase leg 14. The third gate drive voltage, $V_{G2}$, for switch $Q_2$ is available from bootstrap capacitor $C_{B2}$ charged at 102. At 106, bootstrap capacitor $C_{B1}$ is charged through a current path from gate drive voltage source $V_{GD}$, bootstrap capacitor $C_{B1}$ and switches $Q_2$-$Q_3$. Once all the capacitors are charged, the converter can enter operational mode at 108.

Embodiments of the gate drive power supply provide several benefits. The topology reduces part count and the complexity of the gate drive circuitry. As the part count is smaller, the circuit board area and total weight are reduced. The gate drive power supply provides lower power loss at system stand-by as compared to transformer isolated power supplies. The gate drive power supply provides a reduction of the total price for low power three level units. The gate drive power supply makes three level NPC topology attractive and cost competitive to the standard two level converters, while offering better performance in terms of efficiency and EMI. Due to the usage of lower voltage rating devices, which have lower parasitic capacitances and lower gate charge, the gate drive power supply can be applied to higher power converters than bootstrap gate drive supplies applied to the standard two level converters.

The terminology used herein is for the purpose of describing particular embodiments only and is not intended to be limiting of the invention. While the description of the present invention has been presented for purposes of illustration and description, it is not intended to be exhaustive or limited to the invention in the form disclosed. Many modifications, variations, alterations, substitutions, or equivalent arrangement not hereto described will be apparent to those of ordinary skill in the art without departing from the scope and spirit of the invention. Additionally, while the various embodiments of the invention have been described, it is to be understood that aspects of the invention may include only some of the described embodiments. Accordingly, the invention is not to be seen as being limited by the foregoing description, but is only limited by the scope of the appended claims.

The invention claimed is:

1. A neutral point clamped, multilevel level converter, comprising:
    a DC voltage link having a positive rail and a negative rail;
    a phase leg coupled to an AC node, the phase leg having a first switch and a second switch in series between the negative rail and the AC node, the phase leg having a third switch and a fourth switch in series between the positive rail and the AC node; and
    a gate drive power supply having a charge pump section, the charge pump section generating a first gate drive voltage for the first switch and a second gate drive voltage for the second switch;
    wherein the gate drive power supply includes a bootstrap section, the bootstrap section generating a third gate drive voltage for the third switch and a fourth gate drive voltage for the fourth switch.

2. The neutral point clamped, multilevel level converter of claim 1, wherein:
    the gate drive power supply includes a single gate drive voltage source to supply the first gate drive voltage and the second gate drive voltage.

3. The neutral point clamped, multilevel level converter of claim 2, wherein:
    the charge pump section includes a first voltage regulator for generating the first gate drive voltage from the single gate drive voltage source.

4. The neutral point clamped, multilevel level converter of claim 2, wherein:
    the charge pump section includes a boost capacitor coupled to the single gate drive voltage source, the boost capacitor transferring voltage to a high-side capacitor to supply the second gate drive voltage.

5. The neutral point clamped, multilevel level converter of claim 4, wherein:
    the charge pump section includes a second voltage regulator coupled to the high-side capacitor for generating the second gate drive voltage.

6. The neutral point clamped, multilevel level converter of claim 1, wherein:
the gate drive power supply includes a single gate drive voltage source to supply the first gate drive voltage, the second gate drive voltage, the third gate drive voltage and the fourth gate drive voltage.

7. The neutral point clamped, multilevel level converter of claim 1, wherein:
the boot-strap section includes a first bootstrap capacitor for supplying the third gate drive voltage.

8. The neutral point clamped, multilevel level converter of claim 7, wherein:
the boot-strap section includes a third voltage regulator coupled to the first bootstrap capacitor for generating the third gate drive voltage.

9. A neutral point clamped, multilevel level converter, comprising:
a DC voltage link having a positive rail and a negative rail;
a phase leg coupled to an AC node, the phase leg having a first switch and a second switch in series between the negative rail and the AC node, the phase leg having a third switch and a fourth switch in series between the positive rail and the AC node; and
a gate drive power supply having a charge pump section, the charge pump section generating a first gate drive voltage for the first switch and a second gate drive voltage for the second switch;
wherein the gate drive power supply includes a bootstrap section, the bootstrap section generating a third gate drive voltage for the third switch and a fourth gate drive voltage for the fourth switch;
the bootstrap section includes a first bootstrap capacitor for supplying the third gate drive voltage;
the boot-strap section includes a second bootstrap capacitor for supplying the fourth gate drive voltage.

10. The neutral point clamped, multilevel level converter of claim 9, wherein:
the boot-strap section includes a fourth voltage regulator coupled to the second bootstrap capacitor for generating the fourth gate drive voltage.

11. A neutral point clamped, multilevel level converter, comprising:
a DC voltage link having a positive rail and a negative rail;
a phase leg coupled to an AC node, the phase leg having a first switch and a second switch in series between the negative rail and the AC node, the phase leg having a third switch and a fourth switch in series between the positive rail and the AC node; and
a gate drive power supply having a charge pump section, the charge pump section generating a first gate drive voltage for the first switch and a second gate drive voltage for the second switch;
wherein the gate drive power supply includes a bootstrap section, the bootstrap section generating a third gate drive voltage for the third switch and a fourth gate drive voltage for the fourth switch;
wherein the bootstrap section includes a first bootstrap capacitor for supplying the third gate drive voltage;
wherein the bootstrap section includes a second bootstrap capacitor for supplying the fourth gate drive voltage;
wherein the charge pump section operates an initialization process, the initialization process including closing the first switch and the second switch to charge the first bootstrap capacitor.

12. The neutral point clamped, multilevel level converter of claim 11, wherein:
the initialization process including closing the second switch and the third switch to charge the second bootstrap capacitor.

* * * * *